(12) United States Patent
Nakamura

(10) Patent No.: US 8,261,222 B2
(45) Date of Patent: Sep. 4, 2012

(54) METHODS FOR ANALYZING AND ADJUSTING SEMICONDUCTOR DEVICE, AND SEMICONDUCTOR SYSTEM

(75) Inventor: Yuichi Nakamura, Tokyo (JP)

(73) Assignee: NEC Corporation, Tokyo (JP)

( * ) Notice: Subject to any disclaimer, the term of this patent is extended or adjusted under 35 U.S.C. 154(b) by 198 days.

(21) Appl. No.: 12/744,525

(22) PCT Filed: Nov. 17, 2008

(86) PCT No.: PCT/JP2008/070885
§ 371 (c)(1),
(2), (4) Date: May 25, 2010

(87) PCT Pub. No.: WO2009/069496
PCT Pub. Date: Jun. 4, 2009

(65) Prior Publication Data
US 2010/0262942 A1 Oct. 14, 2010

(30) Foreign Application Priority Data
Nov. 26, 2007 (JP) ................................. 2007-304900

(51) Int. Cl.
*G06F 17/50* (2006.01)
(52) U.S. Cl. ........ 716/114; 716/108; 716/113; 716/132; 716/134; 716/136
(58) Field of Classification Search .................. 716/108, 716/113–114, 134, 136, 132
See application file for complete search history.

(56) References Cited

U.S. PATENT DOCUMENTS 6,546,531 B1* 4/2003 Quach et al. .................. 716/114
6,990,646 B2* 1/2006 Yoshikawa .................... 716/114
2002/0073389 A1* 6/2002 Elboim et al. ..................... 716/6
2006/0184906 A1* 8/2006 Aizawa ............................. 716/6

FOREIGN PATENT DOCUMENTS

| JP | 2002313916 A | 10/2002 |
|---|---|---|
| JP | 2004133525 A | 4/2004 |
| JP | 2304228504 A | 8/2004 |
| JP | 2006012046 A | 1/2006 |
| JP | 2006227762 A | 8/2006 |
| JP | 3893147 B | 3/2007 |

OTHER PUBLICATIONS

International Search Report for PCT/JP2008/070885 mailed Feb. 3, 2009.
E. Takahashi et al, "Post-Fabrication Clock-Timing Adjustment Using Genetic Algorithms IEEE Journal of Solid-State Circuits", vol. 39, No. 4: Apr. 2004, pp. 643-650.

* cited by examiner

*Primary Examiner* — Nghia Doan

(57) ABSTRACT

Using fabrication-time variation predicting means that predicts this fact, the variation is predicted beforehand at the design stage prior to fabrication and is stored in variation prediction storage means. Rather than measuring a delay, testing an operation is performed (by a pass/fail determination) by actual-speed logic operation testing means for checking, after fabrication, whether a flip-flop (FF) operates at a specified operation frequency. As a result, the variation is estimated using the non-operation flip-flop (FF) information and the predicted value of the variation from the fabrication-time variation predicting means, and a delay value which corrects for the variation is inserted into a fabricated semiconductor integrated circuit by post-fabrication delay insertion position/value determining means using the variation value that has been estimated.

6 Claims, 9 Drawing Sheets

METHODS FOR ANALYZING AND ADJUSTING SEMICONDUCTOR DEVICE, AND SEMICONDUCTOR SYSTEM

This application is the National Phase of PCT/JP2008/070885, filed on Nov. 17, 2008, which claims the benefit of previous Japanese Patent Application No. 2007-304900 (filed on Nov. 26, 2007), which is hereby incorporated by reference herein in its entirety.

TECHNICAL FIELD

This invention relates to a semiconductor device and, more particularly, to a semiconductor device adjustment method and system in which adjustment of a timing operation is made possible by adjusting delay in the semiconductor device.

BACKGROUND ART

As examples of semiconductor integrated circuits in which the timing operation is capable of being adjusted by adjusting a delay in a semiconductor device after its fabrication, thereby enabling a device that has failed to be utilized as a pass device, refer to the descriptions rendered in Patent Documents 1, 2 and Non-Patent Document 1, etc., by way of example. A digital system (clock adjustment method) disclosed in Patent Document 1 includes a semiconductor integrated circuit device 1, a digital test signal generation apparatus 8, a digital signal observation apparatus 7 for operating upon obtaining a signal indicative of the internal status of a digital system, and an adjustment apparatus 6, as illustrated in FIG. 7. FIG. 8 (FIG. 13 in Patent Document 1) is a diagram useful in describing the operation of FIG. 7.

Following fabrication of the semiconductor integrated circuit, the digital test signal generation apparatus 8 generates a signal (step S2 in FIG. 8), the condition of propagation of the signal in the semiconductor integrated circuit device 1 is measured (step S3 in FIG. 8) utilizing the digital signal observation apparatus 7 which receives one or mode signals each indicative of an internal state of a digital system and one or more digital output signals. If there is an error in operation, then the adjustment apparatus 6 performs an adjustment so as to accommodate for variations in the semiconductor integrated circuit device using a value measured from the propagation condition (step S6 in FIG. 8). As a result of this adjustment operation, a delay is inserted for the purpose of accommodating for variations in a clock line that drives the semiconductor integrated circuit, thereby causing the variations to be absorbed. This enables a semiconductor integrated circuit decided once to be a fail device to be used as a pass device.

After the adjustment apparatus 6 completes the adjustment operation, the series of operations (steps S2 to S7 in FIG. 8), which includes again generating the signal from the digital test signal generation apparatus 8, applying this signal to the semiconductor integrated circuit device 1 and performing the adjustment by the adjustment apparatus 6 utilizing the result of observing the outputs of the semiconductor integrated circuit device by the digital signal observation apparatus 7, is repeatedly executed until a pass ratio that utilizes the result of observation by the digital signal observation apparatus 7 falls below a fixed value. That is, internal and external observation of the state of propagation in the semiconductor integrated circuit device 1 and multiple measurements utilizing the results of observation are required.

Patent Document 2 discloses a system LSI shown in FIG. 9. As shown in FIG. 9, provided on a clock supply path to a specific block 20 such as a ROM is a clock delay circuit 30, which is composed of a plurality of cascade-connected delay elements 31a to 31c and a selector 32, for selectively outputting a delay clock signal DCK in accordance with a delay control signal DCN. When a product device is tested, the operation of the specific block 20 is tested by applying the delay control signal DCN from a delay adjustment terminal 51 via a selector 43, the value of the delay control signal DCN for which normal operation is obtained is examined, and the value of a suitable delay control signal obtained by a product test is stored in a delay setting circuit 40, which is constituted by a fuse circuit or PROM. At the time of a normal operation, the content stored in the delay setting circuit 40 is applied to the clock delay circuit 30 via the selector 43. That is, the value of the delay control signal for which normal operation is obtained following fabrication of the semiconductor integrated circuit is found by a test, the value is applied to the clock delay circuit 30 and a fail semiconductor integrated circuit can be utilized as a pass semiconductor integrated circuit. In a manner similar to that of Patent Document 1 described above, this arrangement also requires that the value of a delay signal be found by testing.

[Patent Document 1]
  JP Patent No. 3893147
[Patent Document 2]
  Japanese Patent Kokai Publication No. JP2006-012046A
[Non-Patent Document 1]
  E. Takahashi, et al., Post Fabrication Clock Timing Adjustment for Digital LSIs with Genetic Algorithms, IEEE Journal of Solid State Circuits, Vol. 39, Issue 4, April 2004, 643-650.

SUMMARY

The particulars disclosed in the above-mentioned Patent Documents 1, 2 and Non-Patent Document 1 are hereby incorporated by reference herein in their entirety. The analysis below is given by the present invention.

A first problem is that with the methods described in Patent Documents 1 and 2, etc., the measurement of a propagation delay within a semiconductor integrated circuit is very difficult. Specifically, with regard to a design method for inserting a delay value into a clock line or signal line of a semiconductor integrated circuit after fabrication, thereby accommodating for variations produced at the time of semiconductor fabrication and thus enabling a semiconductor integrated circuit, which would be a fail device in the absence of insertion of the delay value, to be utilized as a pass device, measurement of the propagation delay in the semiconductor integrated circuit is very difficult, in a case where the delay value is decided by measuring an internal or external signal propagation delay value.

For this reason, it becomes necessary to prepare a dedicated circuit for measurement which is embedded into the semiconductor integrated circuit or to perform measurement using a specific apparatus.

Further, although measuring the signal propagation delay value from outside the semiconductor integrated circuit is not as difficult as measuring the propagation delay in the semiconductor integrated circuit, use of an expensive measurement apparatus is required.

A second problem is that taking into consideration the effects of an adjustment value obtained utilizing measurement result, the adjustment is performed up to a target value, where the amount of accommodation for variations becomes smaller than a specified particular value. As a consequence, it is required that the measurement be performed a number of times until the adjustment value is determined.

Accordingly, an object of the present invention is to provide low-cost and simple methods of analyzing and adjusting a semiconductor device, as well as such a system, in which it is unnecessary to prepare a unit for measuring a signal delay in a semiconductor device in which delay insertion in clock-line and signal-line after fabrication and a post-fabrication adjustment of a timing operation are enabled.

The invention is summarized as follows, though not limited thereto.

In accordance with the present invention, there is provided a method of analyzing a semiconductor device. The method analyzes a defect caused by a variation in the semiconductor device having a circuit driven by a clock signal and comprises:

predicting a variation in the semiconductor device using timing information, included in design data information of the semiconductor device;

testing an operation state of the semiconductor device targeted for analysis, using a semiconductor test equipment; and analyzing a cause of non-operation of the semiconductor device, based upon a prediction result of the variation and a test result of the operation state of the semiconductor device.

In accordance with the present invention, there is provided an adjustment method comprising:

analyzing a cause of non-operation by the method of analyzing the semiconductor device according to the above described method, wherein a semiconductor device in which the timing operation is rendered adjustable by insertion of a delay after fabrication is adopted as a target of analysis;

deciding an insertion position of a delay and a delay amount to be inserted in the semiconductor device, based upon an analysis result of the cause of the non-operation; and inserting a delay of the decided amount at the decided delay insertion position in the semiconductor device to adjust the semiconductor device.

In accordance with the present invention, there is provided a system comprising:

a variation predicting means that predicts a variation in a semiconductor device which includes a circuit driven by a clock signal, using timing information included in design data information of the semiconductor device; and a means that analyzes a cause of non-operation of the semiconductor device, based upon a prediction result of the variation and a test result of the operation state of the semiconductor device using a operation testing means that performs testing of the operation state of the semiconductor device.

In accordance with the present invention, there is provided a system further comprising:

a delay insertion position/value determining means that decides a delay insertion position and a delay insertion amount in a signal and/or clock in the semiconductor device, based upon the analysis result of the cause of non-operation in the semiconductor device; and a delay inserting means that inserts a delay at the delay insertion position in the semiconductor device.

In accordance with the present invention, a unit for measuring a variation in interconnections of a semiconductor integrated circuit device after fabrication need not be provided internally or externally of the semiconductor integrated circuit device. This makes it possible to realize a cost reduction and simplification.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

PREFERRED MODES

Figure 1:
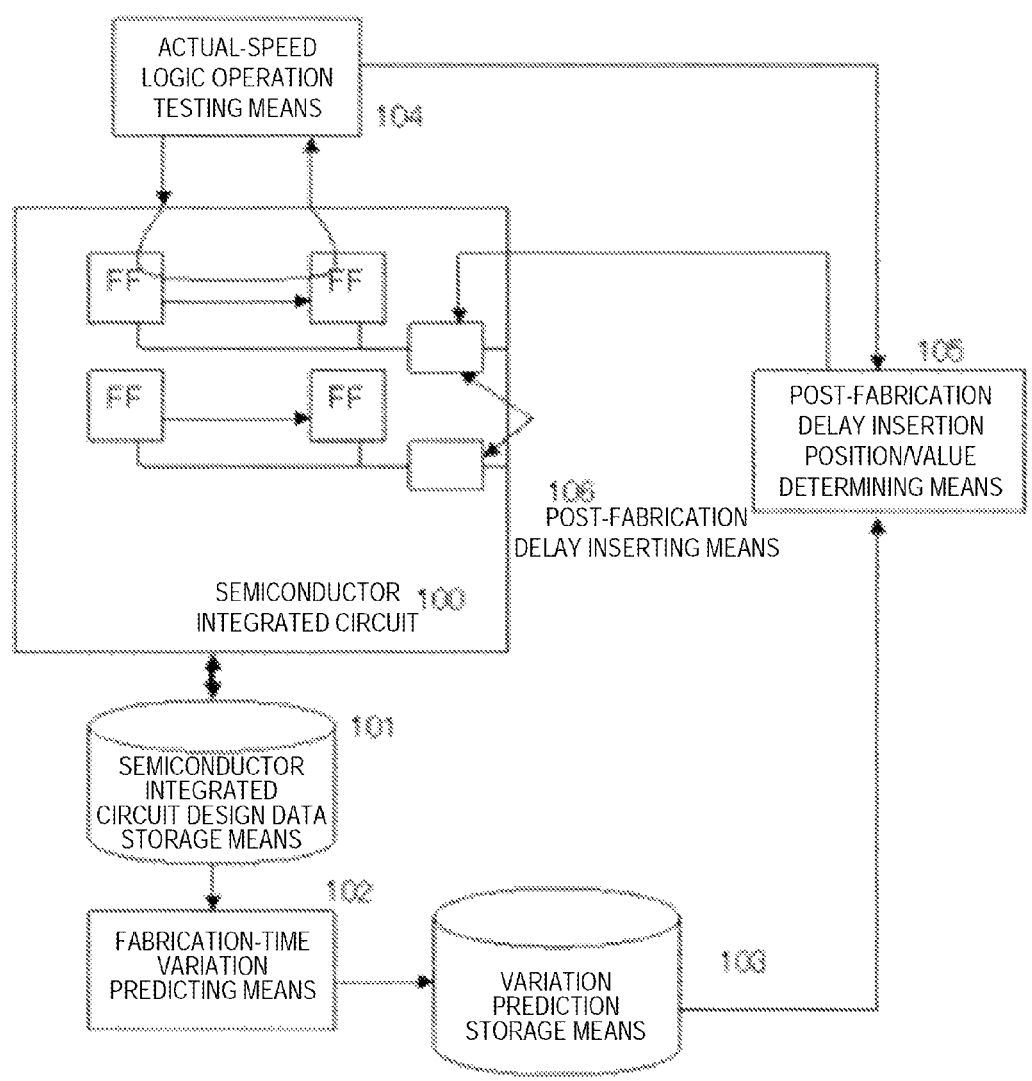
FIG. 1 is a diagram illustrating the configuration of an exemplary embodiment of the present invention.

Exemplary embodiments will now be described with reference to the accompanying drawings for the purpose of describing, in greater detail, the above described present invention above. One of exemplary embodiments of the present invention includes a fabrication-time variation predicting means (unit)(102), a variation prediction storage means (unit)(103), an actual-speed logic operation testing means (unit)(104), a post-fabrication delay insertion position/value determining means (unit)(105) and a post-fabrication delay inserting means (unit)(106). Non-operation of a flip-flop (FF) in a semiconductor device (semiconductor integrated circuit) 100 is computed and predicted beforehand at the time of design prior to fabrication, using the fabrication-time variation predicting means (unit)(102), which predicts that the variation relating to a signal that arrives at the flip-flop (FF) will exceed a particular fixed value, and the result is stored in variation prediction storage means (unit)(103). Whether the flip-flop (FF) in the semiconductor device (semiconductor integrated circuit) (100) operates at a specified operation frequency is checked after fabrication by the actual-speed logic operation testing means (unit) (104). The actual-speed logic operation testing means (unit) (104) does not perform delay measurement but performs a pass/fail test of the operation, at, e.g., an actual device operation speed. Based upon the variation prediction result and the operation test result of the semiconductor device, the post-fabrication delay insertion position/value determining means (105) determines the delay insertion position and insertion amount in a signal and/or clock in the semiconductor device (100). In the exemplary embodiment of the present invention, the variation is estimated using the non-operation flip-flop (FF) information and the predicted value of the variation from the variation prediction storage means (unit) (103). Operation is such that a delay value which corrects for the variation is inserted into the fabricated semiconductor integrated circuit by the post-fabrication delay inserting means (106) using the estimated variation value. By adopting such an arrangement, without measuring a variation value caused by a failure in a fail device after fabrication using a unit inside or outside the semiconductor integrated circuit device, the variation value, can be estimated using an estimated value and the non-operation information.

In accordance with an exemplary embodiment, the semiconductor device (semiconductor integrated circuit) (100) includes first and second flip-flops that are supplied with a common clock signal and output data in response to the clock signal, wherein the second flip-flop is connected to the output of the first flip-flop and samples output data from the first flip-flop in response to the clock signal. With regard to this semiconductor device, the variation predicting means (unit) (102) derives a signal propagation time between the first and second flip-flops beforehand from design data of the semiconductor device. For example, a signal propagation delay, which has been found by performing at least one of addition and subtraction of a margin between the first and second flip-flops to and or from signal propagation delay between the first and second flip-flops, is subtracted from an assumed clock operation period and the result is adopted as a variation prediction value.

The operation testing means (unit) (104) sets a prescribed value at the data input of the first flip-flop in the semiconductor device, causes the first and second flip-flops to operate at a prescribed clock period and compares the output of the second flip-flop with an expected value, thereby deciding operation/non-operation of the second flip-flop.

In a case where a test result by the operation testing means (unit) (104) is that the second flip-flop is non-operation owing to a variation between clock arrival time of the first flip-flop and clock arrival time of the second flip-flop, the delay insertion position/value determining means (unit) (105) and delay inserting means (unit) (106), based upon a determination that a difference (D1−D2) has developed between the clock arrival time of the first flip-flop and the clock arrival time of the second flip-flop that will not satisfy a prescribed conditional expression defined in relation to the difference (D1−D2) (referred to as "signal propagation time") between the clock arrival time (D1) of the first flip-flop and the clock arrival time (D2) of the second flip-flop, the derived signal propagation time ($\delta$) between the first and second flip-flops and a clock operation period (T), insert a first and/or second delay into a clock signal line to a clock path to the first flip-flop and/or clock path to the second flip-flop in such a manner that the difference (D1−D2) between the clock arrival time (D1) of the first flip-flop and the clock arrival time (D2) of the second flip-flop will satisfy the prescribed conditional expression in relation to the signal propagation time ($\delta$) between the first and second flip-flops and the clock operation period (T), and adjust a timing operation that is dependent upon a variation in the clock path to the first and/or second flip-flop at the time of fabrication. The prescribed conditional expression is as follows:

$$\text{first margin} < D1 - D2 + \delta < T - \text{second margin}$$

(where, there is cause in which the values of the first and second margins are zero).

In an exemplary embodiment of the present invention, the variation predicting means (unit) (102) computes the signal propagation time between the first and second flip-flops, which are connected by a signal line, based upon the design data of the semiconductor device, adds a prescribed margin to this signal propagation time, and stores a value [T−(margin+$\delta$)], which is the result of subtracting a value obtained by adding the prescribed margin to the signal propagation time from the operation clock period of the semiconductor device, as a variation predicted value.

By performing, at the time of design, estimation regarding to what extent the non-operation of a flip-flop (FF) in a semiconductor device (semiconductor integrated circuit) (100) corresponds to a variation and holding a variation value, only a normal operation test as to whether the flip-flop (FF) will operate or not is performed and a variation value is estimated based upon the normal operation test result and the variation value estimated in advance.

A variation value can be estimated and decided by a single actual-speed operation test without conducting inspection and testing multiple times. The reason for this is that rather than measuring delay after fabrication, a variation value in a case where each flip-flop (FF) fails to operate is predicted in advance and the estimation of variation value is completed by only a single matching of the predicted variation value and the information on the non-operation flip-flop (FF). Exemplary embodiments will now be described.

FIG. 1 is a diagram illustrating the configuration of a system (a semiconductor design and fabrication system) according to an exemplary embodiment of the present invention. With reference to FIG. 1, the system includes:

a semiconductor integrated circuit 100 that is designed and fabricated;

a semiconductor integrated circuit design data storage means (unit) 101 in which design data of the semiconductor integrated circuit 100 is stored;

a fabrication-time variation predicting means (unit) 102 that predicts variation at the time of fabrication;

a variation prediction storage means (unit) 103 that stores a prediction result of fabrication-time variation;

an actual-speed logic operation testing means (unit) 104 that performs operation test of a semiconductor integrated circuit at a frequency in a situation where an LSI chip is actually utilized; a post-fabrication delay insertion position/value determining means (unit) 105 that determines a delay insertion location and a delay amount for post-fabrication; and a post-fabrication delay inserting means (unit) 106 that carries out a delay insertion after fabrication of the semiconductor integrated circuit. These means (units) operate in general as set forth below.

Through a static timing verification or a delay simulation of a semiconductor integrated circuit, information (timing information) as to how much variation must be produced to result in non-operation of the circuit is stored as design data information in the semiconductor integrated circuit design data storage means 101.

The fabrication-time variation predicting means 102 predicts a variation value, which arises in a case where a flip-flop (FF) driven by a common clock signal in the semiconductor integrated circuit 100 fails to operate by utilizing a delay (propagation delay time) between flip-flops (FF) in the circuit. This delay is generally analyzed at the design stage of the semiconductor integrated circuit using the design data information from the semiconductor integrated circuit design data storage means 101. As will be described later, the fabrication-time variation predicting means 102 calculates a value for adjusting post-fabrication delay means for the purpose of adjusting timing and accommodating for variation, depending upon how much variation is produced at the time of fabrication, using the following relation with regard to each flip-flop pair of a flip-flop FF1(i) and a flip-flop FF2(i) (where i is a prescribed positive integer) to which the output data of the flip-flop FF(i) is supplied:

$$-\delta(i) < (D1(i)+\lambda 1(i)) - (D2(i)+\lambda 2(i)) < T-\delta(i)$$

(where D1(i) is a clock arrival time of FF1(i);

δ1(i) is a delay inserted into the signal path or clock path of FF1(i);

D2(i) is a clock arrival time of FF2(i);

λ2(i) is a delay inserted into the signal path or clock path of FF2(i);

δ(i) is a propagation delay time found by performing at least one of addition and subtraction of a margin (delay assurance margin) to and/or from the propagation delay time in the FF pair of FF1(i) and FF2(i); and T is an assumed clock period.

The variation prediction storage means 103 stores the predicted value of the variation value, with which the flip-flop (FF) is in non-operation, and which has been predicted by the fabrication-time variation predicting means 102.

The actual-speed logic operation testing means 104 carries out an operation test (for example, a functional test) of the semiconductor integrated circuit 100 at an operation frequency that prevails in an actual-use situation, for example. The operation test is executed to determine whether the output of a particular circuit included in the semiconductor integrated circuit matches an expected value. If the test result is that the semiconductor integrated circuit operates (i.e., in case of pass), then the fact that the circuit operates is output. In case of non-operation, information on the non-operation flip-flop FF (FF) is output. The actual-speed logic operation testing means 104 utilizes test items for deciding whether the semiconductor device product operates well, or what part of the semiconductor device product fails to operate, at an operation frequency actually utilized by the semiconductor integrated circuit that undergoes inspection.

The post-fabrication delay insertion position/value determining means 105 determines how much delay should be inserted into a delay insertion element of the post-fabrication delay inserting means 106 based upon non-operation flip-flop (FF) information detected by the actual-speed logic operation testing means 104 and the variation prediction value that has been stored in the variation prediction storage means 103 if a non-operation flip-flop (FF) has occurred. The post-fabrication delay insertion position/value determining means 105 (the "/" represents "and", indicating that a delay insertion position and value are decided) decides which post-fabrication delay means is to be adjusted after fabrication and decides the amount of adjustment of the post-fabrication delay means the adjustment of which has been decided.

The post-fabrication delay inserting means 106, which actually inserts the delay after fabrication, applies the delay to the semiconductor integrated circuit 100 after fabrication in order to adjust the timing operation ascribable to variation and make it possible to change a fail device to a pass device. The post-fabrication delay inserting means 106 is a circuit or system, which makes it possible to insert a variable delay, incorporated in the semiconductor integrated circuit 100, and externally applies this delay value after fabrication of the semiconductor integrated circuit 100. A plurality these means are placed in the semiconductor integrated circuit 100 beforehand.

Figure 2:
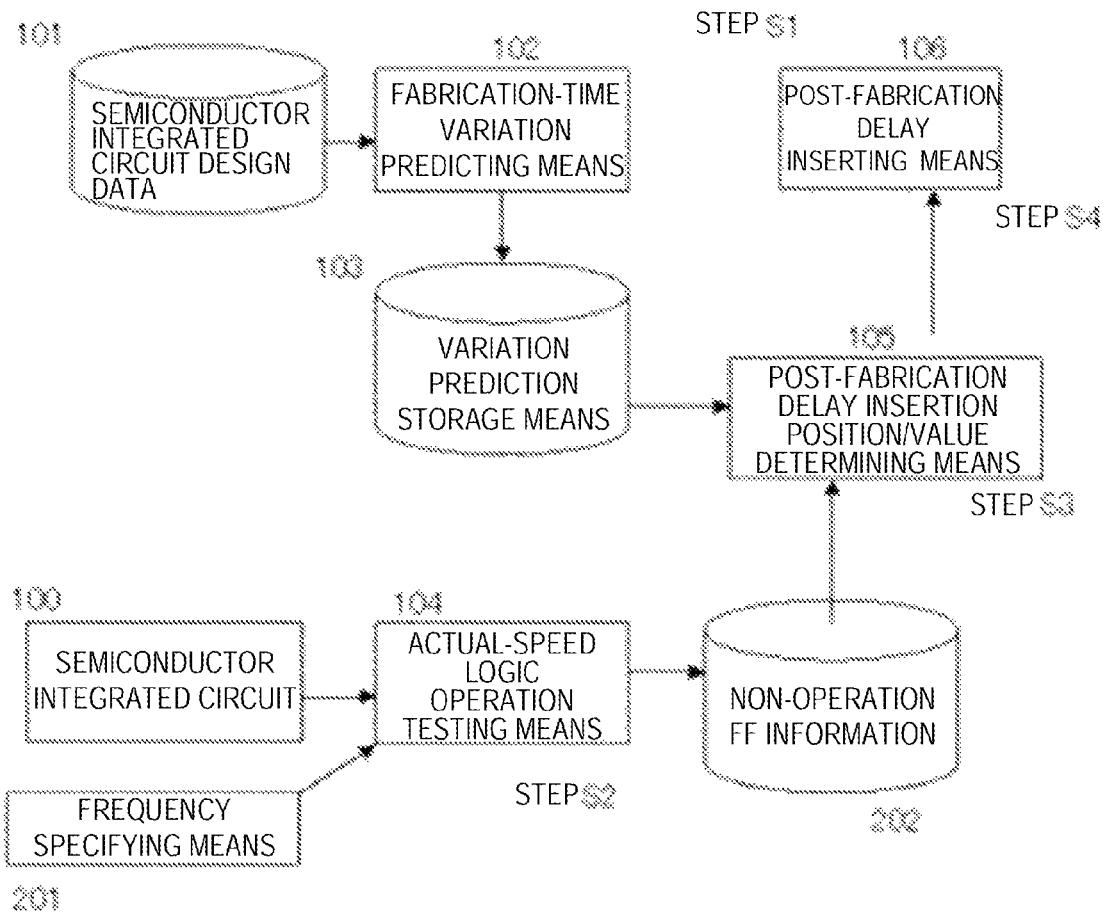
FIG. 2 is a diagram for describing an exemplary embodiment of the present invention.
Figure 3:
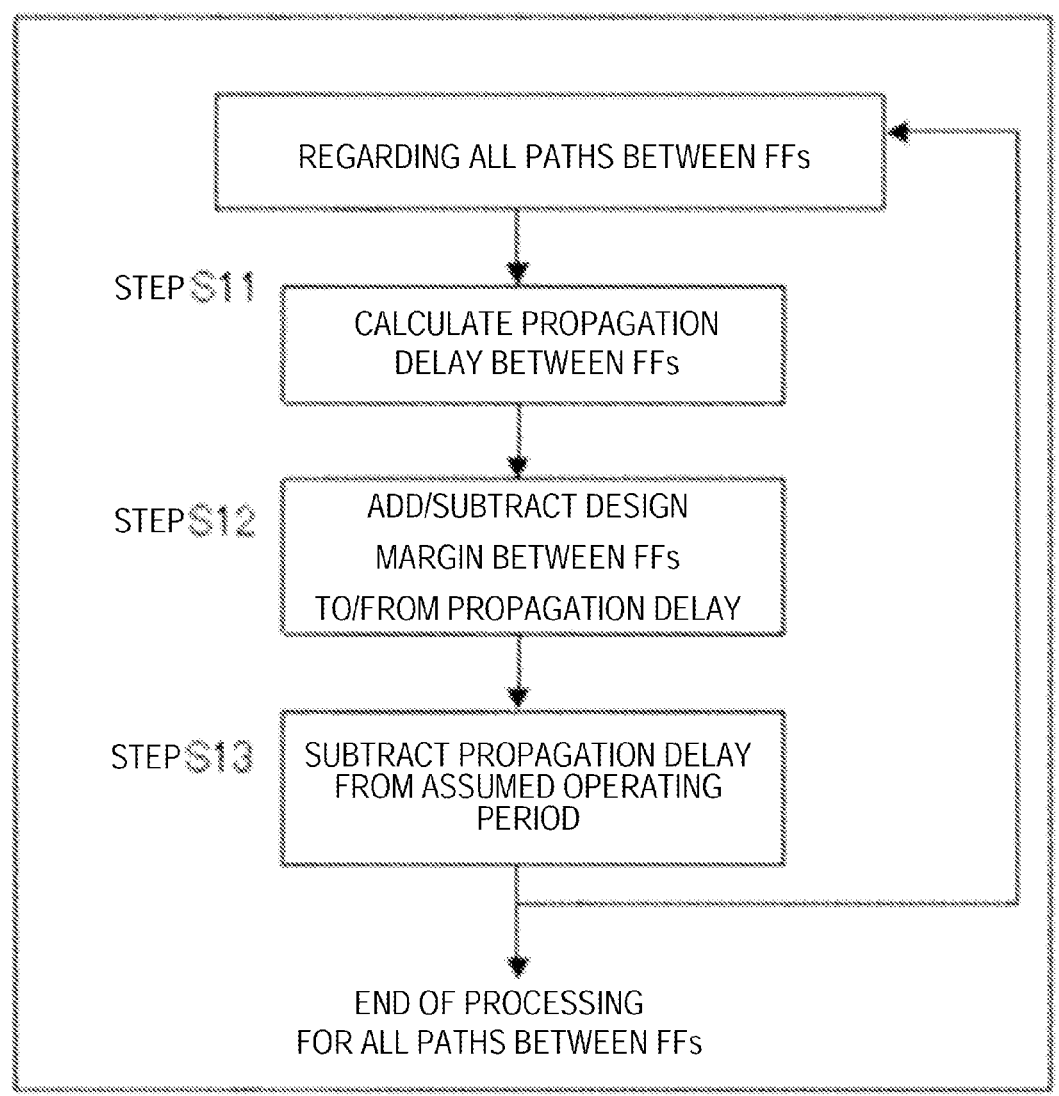
FIG. 3 is a flowchart illustrating operation of variation predicting means at the time of fabrication according to an exemplary embodiment of the present invention.

FIG. 2 is a diagram for describing the operation procedure of the configuration shown in FIG. 1. FIG. 3 is a flowchart for describing the operation of the fabrication-time variation predicting means 102.

Before the semiconductor integrated circuit 100 is fabricated, i.e., at the design stage of the semiconductor integrated circuit 100, based upon data from the semiconductor integrated circuit design data storage means 101 for storing design data actually utilized, when the semiconductor integrated circuit is fabricated, the predicted value of a variation value that prevails in a case where a particular flip-flop (FF) fails to operate after fabrication is calculated by the fabrication-time variation predicting means 102, utilizing the propagation delay of two flip-flops (FF) connected by a signal line, and the calculated prediction value is stored in the variation prediction storage means 103 (step S1 in FIG. 2)

The fabrication-time variation predicting means 102 operates at this time according to the procedure shown in FIG. 3.

Specifically, the fabrication-time variation predicting means 102 calculates the propagation delay time between FFs with regard to paths between flip-flops (FF) in the semiconductor integrated circuit 100 (step S11 in FIG. 3). The fabrication-time variation predicting means 102 may calculate the propagation delay times between all flip-flops (FF) in the semiconductor integrated circuit 100 all-inclusively, or may calculate the propagation delay times between FFs selectively with regard to locations (e.g., critical paths, etc.) that are sensitive to variations.

Next, the fabrication-time variation predicting means 102 adds a specified margin to the propagation delay time (step S12 in FIG. 3).

The fabrication-time variation predicting means 102 subtracts the propagation delay, which is the result of adding the margin (delay assurance margin) to the propagation delay time δ, from the assumed operation period T of the clock of semiconductor integrated circuit 100 (step S13 in FIG. 3). The result of subtraction (T−margin−δ) is stored in the variation prediction storage means 103, as illustrated in FIG. 2. It should be noted that if the margin is zero, then (T−margin−δ) becomes (T−δ) (this will be described later).

Next, after the semiconductor integrated circuit 100 is fabricated, the fabricated semiconductor integrated circuit 100 is subjected to an operation inspection, using the actual-speed logic operation testing means 104 at an operation frequency specified by the frequency specifying means 201, which applies the operation frequency that prevails when the semiconductor integrated circuit 100 is actually used, and the flip-flops are classified into operational flip-flops (FF) (those that have passed the functional test) and non-operation flip-flops (FF) (those that have failed the functional test). The set of non-operation flip-flops (FF) is stored in the non-operation FF information 202 as a failure information list (step S2 in FIG. 2). It should be noted that if the actual-speed logic operation testing means 104 can apply application data to the flip-flops (FF), apply a clock having a prescribed operation frequency (e.g., a frequency compatible with the actual-speed logic operation), compare the output data of a prescribed flip-flop (FF) with an expected value and judge operation (pass)/non-operation (fail), then any test information (circuit) can be used. For example, an at-speed test may be conducted utilizing at least one of the following:

an LSI tester;

a BIST (Built-In Self-Test), which conducts an operating test in the semiconductor integrated circuit 100; and a scan test.

The variation value (variation in delay) is decided from the variation estimation value concerning each flip-flop (FF) obtained at step S1 in FIG. 2 and the non-operation flip-flop (FF) information obtained at step S2, and the post-fabrication delay insertion position/value determining means 105 decides the post-fabrication delay insertion position and delay amount so as to correct for this variation value (step S3 in FIG. 2).

The delay value specified by the post-fabrication delay insertion position/value determining means 105 is inserted by the post-fabrication delay inserting means 106 at the position specified by the post-fabrication delay insertion position/value determining means 105, whereby a semiconductor integrated circuit that is a fail device is changed to a pass device.

In this exemplary embodiment, post-fabrication evaluation and measurement of a semiconductor integrated circuit are implemented solely by an operation test of flip-flops (FF) at the actual operation frequency. This dispenses with the need for a delay measurement circuit internally and externally of the semiconductor integrated circuit and it is possible to change a fail semiconductor integrated circuit to a pass device. Further, in this exemplary embodiment, the predicted value of variation for each flip-flop (FF) need be compared against the test result of flip-flop (FF) operation only a single time.

In this exemplary embodiment, the acquisition of variation information relating to the operation of each flip-flop, which heretofore required a measurement apparatus internally or externally of the semiconductor integrated circuit, can be achieved easily, if processing is completely by execution only of steps S1 and S2 of FIG. 2.

Figure 4:
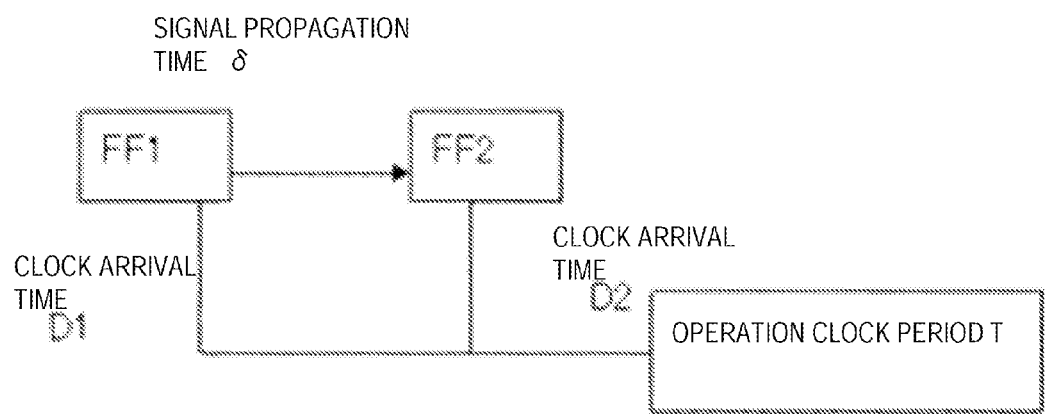
FIG. 4 is a diagram for describing an exemplary embodiment of the present invention.

A more specific example will be described. As shown in FIG. 4, a semiconductor integrated circuit includes flip-flops (FF1, FF2 . . . ), a clock signal of an operation period T supplied to the flip-flops, and a signal propagation time $\delta$ which is modeled as a propagation delay that is the result of passing through one or more circuit elements and one ore more interconnects between flip-flops.

The signal propagation time $\delta$ is designed to be a value smaller than the operation period T. However, owing to the fact that the signal propagation paths are different, etc., the clock signal supplied to the flip-flops FF1 and FF2, whose input and output is the propagation signal of signal propagation time $\delta$, has mutually different clock arrival times, namely D1 and D2, respectively.

In order for the flip-flop FF2 to operate normally, it is required that expression (1) below be satisfied, where the minimum delay assurance margin is flip-flop hold time, clock waveform distortion and noise, and the maximum delay margin is flip-flop setup time, clock waveform distortion and noise.

It should be noted that a setup time is the time over which data must be determined prior to a timing signal (effective edge of the clock) in order for data to be correctly sampled by a flip-flop, and a hold time is the time over which data must be held even after a sampling timing signal (effective edge of the clock) has been applied in order to correctly sample data.

$$\text{Minimum delay assurance margin} < D1-D2+\delta < T- \text{maximum delay margin} \quad (1)$$

Alternatively, in an ideal state in which the minimum delay assurance margin and maximum delay margin are both set to zero, we have the following:

$$0 < D1-D2+\delta < T \quad (2)$$

In view of these expressions, even if the relationship between the signal propagation time $\delta$ and clock period T is $$\delta < T,$$

the semiconductor integrated circuit will not operate normally depending upon the values of the clock arrival times D1 and D2. The clock arrival times D1 and D2 are difficult to estimate correctly at the time of design, owing to variations ascribable to various factors, such as physical phenomena where, at the time of fabrication of the semiconductor integrated circuit, some interconnects become finer than was assumed.

As a consequence, even with a semiconductor integrated circuit that satisfies $\delta < T$ and that has been designed so as to be capable of operating even with a certain degree of D1−D2, there are instances where the circuit will not operate after fabrication.

However, it is possible for a fail device that is the result of delay variation or the like to be changed to a pass device by reducing or enlarging the value of D1−D2 by inserting a value into a signal line or clock line.

For example, if delays $\delta 1$ and $\delta 2$ are inserted into D1 and D2, respectively, and $\delta 1$ and $\delta 2$ are set to appropriate values, then it is possible to adjust the value of (D1−D2) in expressions (1), (2) as $$D1-D2 > (D1+\lambda 1) - (D2+\lambda 2)$$

$$D1-D2 < (D1+\lambda 1) - (D2+\lambda 2)$$

In order to select the values of the delays $\lambda 1$ and $\lambda 2$ inserted into D1 and D2, it has been required heretofore to measure the value of D1 and/or D2 directly or indirectly.

By contrast, according to this exemplary embodiment, the variation is predicted by the fabrication-time variation predicting means 102 utilizing the relation of the expression (1) or expression (2). The description below is rendered using expression (2), for the sake of simplicity. The expansion to the expression (1), since it suffices merely to insert the margin value, is easy.

It will be understood from expression (2) that $$-\delta < D1-D2 < T-\delta \quad (3)$$

holds, and it will be understood from the expression (3) that $T-\delta$ is the upper limit of the difference between D1 and D2 and that $-\delta$ is the lower limit.

Specifically, if the signal propagation time $\delta$ between each of the flip-flops (FF) is calculated from the design data, then, in the event that FF2 fails to operate owing to a variation, a value of D1−D2 that does not satisfy the expression (3) will arise.

Accordingly, it will suffice to decide the delays $\lambda 1$ and $\lambda 2$, which are inserted after fabrication, in (D1+$\lambda 1$)−(D2−$\lambda 2$) so as to apply a correction.

Figure 5:
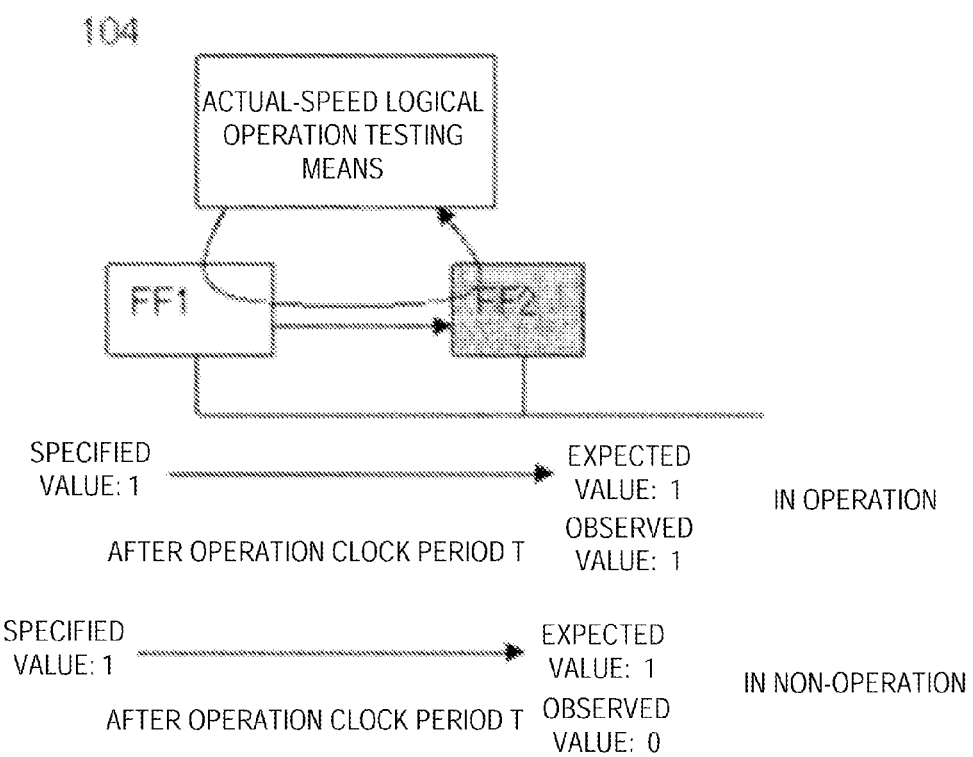
FIG. 5 is a diagram for describing actual-speed logic operation testing means of an exemplary embodiment of the present invention.

As for determining whether FF2 operates or not, it will suffice if the operation test of flip-flop FF2 in terms of the operation clock period is conducted using the actual-speed logic operation testing means 104, as illustrated in FIG. 5.

Specifically, a value is set in flip-flop FF1, the signal is passed into FF2 from flip-flop FF1 with the clock period T, the measured value of this signal (the output of FF2) is compared with the expected value and it is judged that the flip-flop FF2 is in operation if the measured value is the same as the expected value and that the flip-flop FF2 is in non-operation if the measured value does not match the expected value.

If the non-operation of flip-flop FF2 is caused by a variation, then the following expression will hold:

$$-\delta > D1-D2 > T-\delta \quad (4)$$

Accordingly, as for how to select $\lambda 1$ and $\lambda 2$ in order to correct for this, it will suffice if they are decided so as to satisfy the following conditional expression (inequality):

$$-\delta < (D1+\lambda 1) - (D2+\lambda 2) < T-\delta \quad (5)$$

Specifically, with regard to each FF pair (i) (namely first flip-flop FF1(i) and second flip-flop FF2(i) of all FF pairs, it will suffice to find the value of each $\lambda 1, 2(i)$ that will satisfy the following simultaneous system of inequalities:

$$-\delta(1)<(D1(1)+\lambda 1(1))-(D2(1)+\lambda 2(1))<T-\delta(1) \quad (5\text{-}1)$$

$$-\delta(i)<(D1(2)+\lambda 1(2))-(D2(2)+\lambda 2(2))<T-\delta(2) \quad (5\text{-}2)$$

$$-\delta(i)<(D1(i)+\lambda 1(i))-(D2(i)+\lambda 2(i))<T-\delta(i) \quad (5\text{-}i)$$

(where D1(i) is a clock arrival time of FF1(i);
$\lambda 1(i)$ is a delay inserted into the clock path of FF1(i);
D2(i) is a clock arrival time of FF2(i);
$\lambda 2(i)$ is a delay inserted into the clock path of FF2(i);
$\delta(i)$ is a propagation delay time found by performing at least one of addition and subtraction of a margin (delay assurance margin) to and/or from the propagation delay time in the FF pair of FF1(i) and FF2(i); and
T is an assumed clock period.

Figure 6:
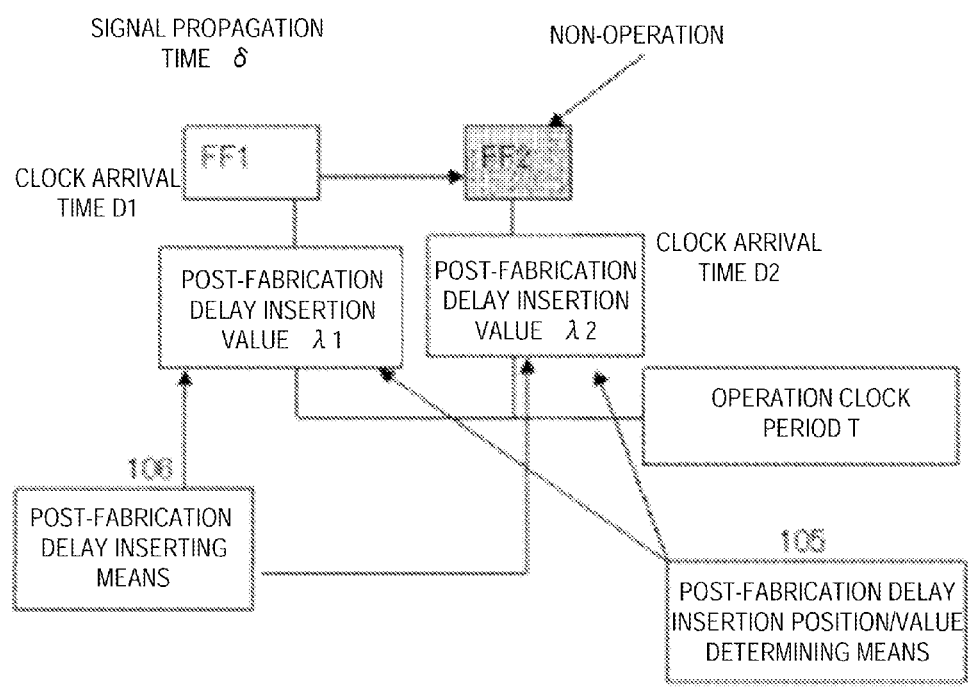
FIG. 6 is a diagram for describing post-fabrication delay insertion position/value determining means of an exemplary embodiment of the present invention.
Figure 7:
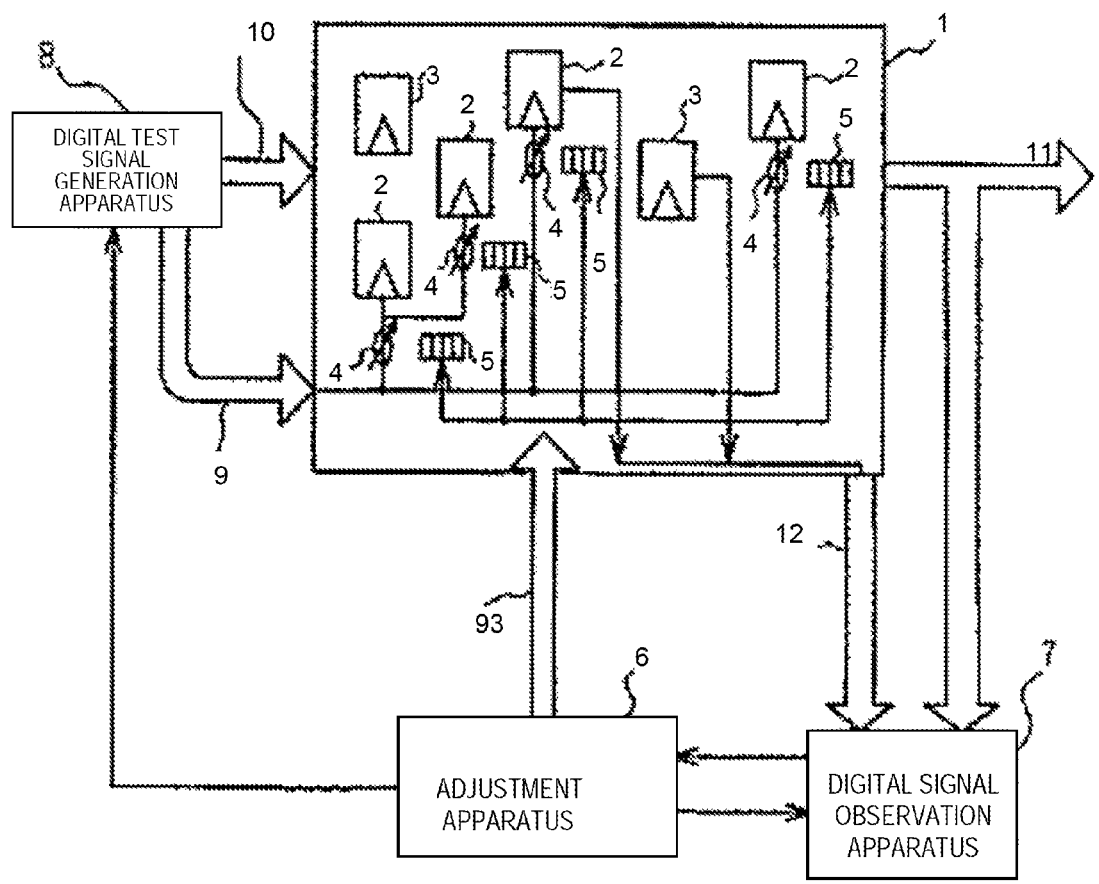
FIG. 7 is a diagram illustrating the configuration of a system disclosed in Patent Document 1.
Figure 8:
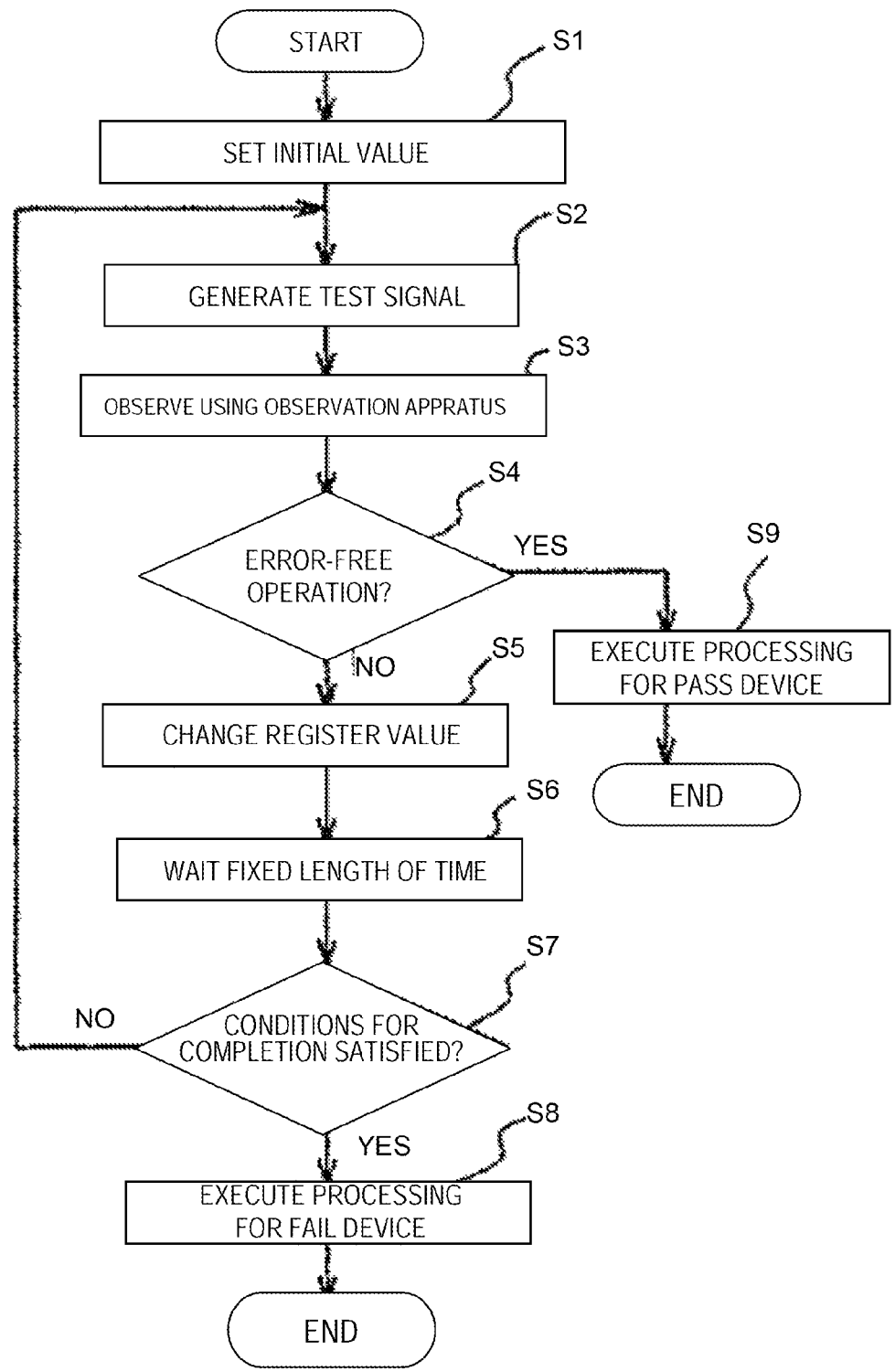
FIG. 8 is a diagram illustrating processing disclosed in Patent Document 1.
Figure 9:
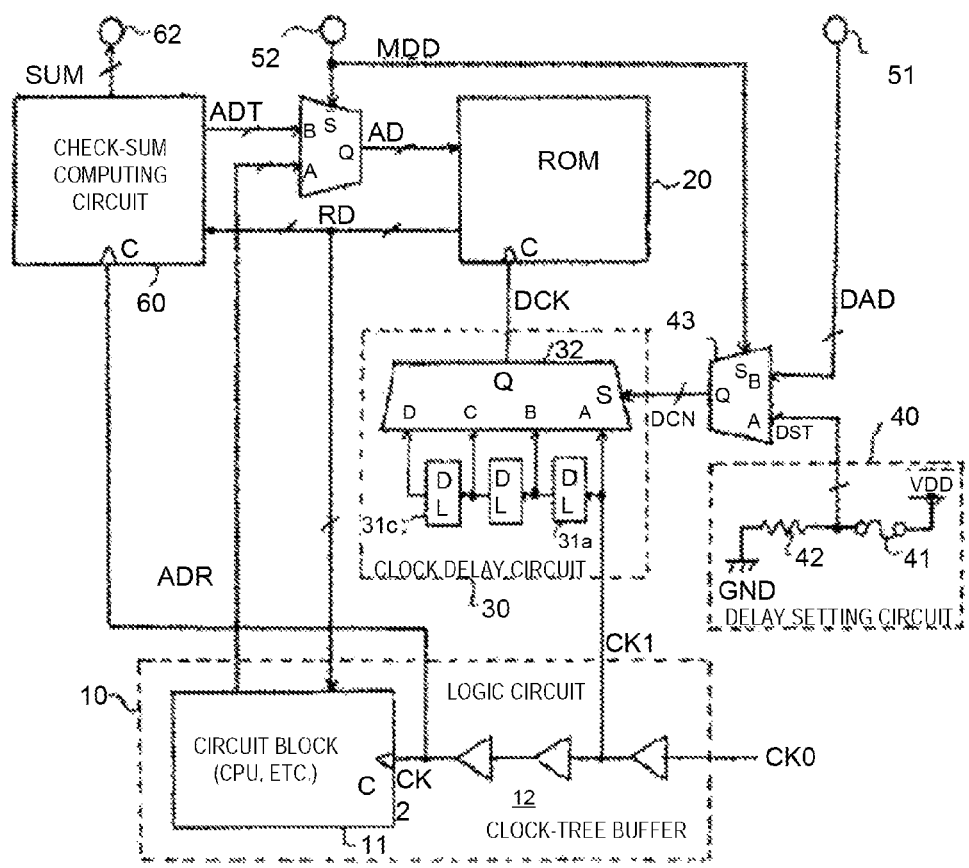
FIG. 9 is a diagram illustrating the arrangement of an LSI system disclosed in Patent Document 2.

As illustrated in FIG. 6, the post-fabrication delay insertion position/value determining means 105 decides the delays (post-fabrication delay insertion values) $\lambda 1$ and $\lambda 2$ that are inserted into the flip-flops FF1, FF2, and the post-fabrication delay inserting means 106 inserts the delays $\lambda 1$ and $\lambda 2$.

In the example described above, there is one path between flip-flops. In actuality, however, similar inequalities are obtained between a plurality of FFs. The post-fabrication delay insertion position/value determining means 105, therefore, solves the simultaneous system of inequalities, decides the value of delay $\lambda i$ inserted into each flip-flop and decides the post-fabrication delay insertion position and amount.

As a result of the foregoing, a fail device ascribable to a variation can be changed to a pass device without a delay measurement device and by only a single operation test. In addition, if the results of the above-mentioned simultaneous system of inequalities are exploited, the value of variation can be estimated.

The present invention can be applied in applications where a design method is implemented for adjusting a clock line or signal line in order to achieve post-fabrication recovery from variations that occur in a semiconductor integrated circuit at the time of fabrication. Further, the present invention can be applied in applications where variations that occur in a semiconductor integrated circuit at the time of fabrication are measured after fabrication and the distribution of variations is examined.

The disclosures of Patent Documents 1 and 2 and Non-Patent Document 1 cited above are incorporated by reference in this specification. Within the bounds of the full disclosure of the present invention (inclusive of the scope of the claims), it is possible to modify and adjust the modes and exemplary embodiments of the invention based upon the fundamental technical idea of the invention. Multifarious combinations and selections of the various disclosed elements are possible within the bounds of the scope of the claims of the present invention. That is, it goes without saying that the invention covers various modifications and changes that would be obvious to those skilled in the art within the scope of the claims.

What is claimed is:

1. A method of analyzing a semiconductor device, which analyzes a defect caused by a variation in the semiconductor device having a circuit driven by a clock signal, the method comprising:
    predicting a variation in the semiconductor device using timing information, which is information as to how much variation in the clock signal must be produced to result in non-operation of the circuit, the timing information being included in design data information of the semiconductor device;
    testing an operation state of the semiconductor device targeted for analysis, using a semiconductor test equipment;
    analyzing a cause of non-operation of the semiconductor device, based upon a prediction result of the variation and a test result of the operation state of the semiconductor device;
    analyzing a cause of non-operation by the method of analyzing the semiconductor device, wherein a semiconductor device in which the timing operation is rendered adjustable by insertion of a delay after fabrication is adopted as a target of analysis;
    deciding an insertion position of a delay and a delay amount to be inserted in the semiconductor device, based upon an analysis result of the cause of the non-operation; and
    inserting a delay of the decided amount at the decided delay insertion position in the semiconductor device to adjust the semiconductor device;
    with regard to the semiconductor device including first and second flip-flops each supplied with a common clock signal for outputting data in response to the clock signal, the second flip-flop receiving as an input output data from the first flip-flop,
    in predicting the variation of the semiconductor device,
    deriving a signal propagation time between the first and second flip-flops of the semiconductor device from design data of the semiconductor device, in advance;
    in inspecting operation state of the semiconductor device,
    setting a prescribed value to a data input of the first flip-flop in the semiconductor device;
    causing the first and second flip-flops to operate at a prescribed clock period; and
    deciding operation/non-operation of the second flip-flop by comparing output data of the second flip-flop with an expected value; and
    in deciding the delay insertion position and an amount of delay,
    in a case where the second flip-flop is in non-operation owing to a variation between a clock arrival time of the first flip-flop and a clock arrival time of the second flip-flop,
    based upon a determination that a difference has developed between the clock arrival time of the first flip-flop and the clock arrival time of the second flip-flop that will not satisfy a prescribed conditional expression defined in relation to the difference between the clock arrival time of the first flip-flop and the clock arrival time of the second flip-flop, the signal propagation time between the first and second flip-flops derived in advance, and the clock period;
    inserting a first and/or second delay into a clock signal path to a clock path to the first flip-flop and/or clock path to the second flip-flop in such a manner that the difference between the clock arrival time of the first flip-flop and the clock arrival time of the second flip-flop will satisfy the prescribed conditional expression in relation to the signal propagation time between the first and second flip-flops and the clock period; and
    adjusting a variation, which prevails at time of fabrication, in the clock path to the first and/or the second flip-flop.

2. The method of adjusting a semiconductor device according to claim 1, wherein the prescribed conditional expression is as follows with respect to prescribed first and second margins:

$$\text{first margin}<D1-D2+\delta<T-\text{second margin}$$

(inclusive of a case where the values of the first and second margins are zero)

where δ is the signal propagation time, derived beforehand, between the first and second flip-flops;

T is the clock period;

D1 is the clock arrival time of the first flip-flop; and

D2 is the clock arrival time of the second flip-flop.

3. The method of adjusting a semiconductor device according to claim 2, in predicting the variation of the semiconductor device, calculating a signal propagation time between the first and second flip-flops, which are connected by a signal line, based upon design data of the semiconductor device;

adding a prescribed margin to the signal propagation time; and storing, as the variation prediction value, a value obtained by subtracting a value, which is the result of adding the prescribed margin to the signal propagation time, from the operation clock period of the semiconductor device.

4. A semiconductor system comprising:

a variation predicting unit that predicts a variation in a semiconductor device which includes a circuit driven by a clock signal, using timing information, which is information as to how much variation in the clock signal must be produced to result in non-operation of a circuit, timing information being included in design data information of the semiconductor device;

a unit that analyzes a cause of non-operation of the semiconductor device, based upon a prediction result of the variation and a test result of the operation state of the semiconductor device using a operation testing unit that performs testing of the operation state of the semiconductor device, wherein with regard to the semiconductor device including first and second flip-flops each supplied with a common clock signal for outputting data in response to the clock signal, wherein the second flip-flop inputs output data from the first flip-flop:

the variation predicting unit derives a signal propagation time between the first and second flip-flops of the semiconductor device beforehand from design data of the semiconductor device;

the operation testing unit sets a prescribed value as the input of the first flip-flop in the semiconductor device, causes the first and second flip-flops to operate at a prescribed clock period and determines operation/non-operation of the second flip-flop by comparing an output of the second flip-flop with an expected value; and in a case where the second flip-flop is in non-operation owing to a variation between a clock arrival time of the first flip-flop and a clock arrival time of the second flip-flop;

based upon a determination that a difference has developed between the clock arrival time of the first flip-flop and the clock arrival time of the second flip-flop that will not satisfy a prescribed conditional expression defined in relation to the difference between the clock arrival time of the first flip-flop and the clock arrival time of the second flip-flop, the derived signal propagation time between the first and second flip-flops and the clock period, the delay insertion position/value determining unit and the delay inserting unit inserts a first and/or second delay into a clock signal path to a clock path to the first flip-flop and/or clock path to the second flip-flop in such a manner that the difference between the clock arrival time of the first flip-flop and the clock arrival time of the second flip-flop will satisfy the prescribed conditional expression in relation to the signal propagation time between the first and second flip-flops and the clock period; and adjusts a variation, which prevails at time of fabrication, in the clock path to the first and/or the second flip-flop.

5. The semiconductor system according to claim 4, wherein the prescribed conditional expression is as follows with respect to prescribed first and second margins:

first margin$<D1-D2+\delta<T-$second margin (inclusive of a case where the values of the first and second margins are zero)

where δ is the signal propagation time, derived beforehand, between the first and second flip-flops;

T is the clock period;

D1 is the clock arrival time of the first flip-flop; and

D2 is the clock arrival time of the second flip-flop.

6. The semiconductor system according to claim 4, wherein the variation predicting unit calculates signal propagation time between the first and second flip-flops, which are connected by a signal line, based upon design data of the semiconductor device;

adds a prescribed margin to the signal propagation time; and stores, as the variation prediction value, a value obtained by subtracting a value, which is the result of adding the prescribed margin to the signal propagation time, from the operation clock period of the semiconductor device.

* * * * *